United States Patent [19]
Wu

[11] Patent Number: 5,656,536
[45] Date of Patent: Aug. 12, 1997

[54] METHOD OF MANUFACTURING A CROWN SHAPED CAPACITOR WITH HORIZONTAL FINS FOR HIGH DENSITY DRAMS

[75] Inventor: Shye-Lin Wu, Hsinchu, Taiwan

[73] Assignee: Vanguard International Semiconductor Corporation, Hsinchu, Taiwan

[21] Appl. No.: 623,678

[22] Filed: Mar. 29, 1996

[51] Int. Cl.$^6$ .................................................. H01L 21/70
[52] U.S. Cl. ................................................................ 438/397
[58] Field of Search ................................. 437/47, 52, 60, 437/919

[56] References Cited

U.S. PATENT DOCUMENTS

| | | | |
|---|---|---|---|
| 5,164,337 | 11/1992 | Ogawa et al. | 437/919 |
| 5,436,186 | 7/1995 | Hsue et al. | 437/919 |
| 5,447,878 | 9/1995 | Park et al. | 437/919 |
| 5,460,999 | 10/1995 | Hong et al. | 437/919 |
| 5,486,488 | 1/1996 | Kamiyama | 437/919 |
| 5,532,182 | 7/1996 | Woo | 437/52 |
| 5,543,346 | 8/1996 | Keum et al. | 437/919 |

*Primary Examiner*—Tuan H. Nguyen
*Attorney, Agent, or Firm*—Christensen, O'Connor, Johnson & Kindness

[57] ABSTRACT

The present invention is a method of manufacturing crown shape capacitors for use in semiconductor memories. High etching selectivity between BPSG (borophososilicate glass) and CVD-oxide (chemical vapor deposition oxide) is used to fabricate a tooth like structure within a crown shaped capacitor. Utilizing the structure as a mold, the present invention can form the crown shape structure with horizontal fins to increase the surface area of the capacitor.

14 Claims, 5 Drawing Sheets

METHOD OF MANUFACTURING A CROWN SHAPED CAPACITOR WITH HORIZONTAL FINS FOR HIGH DENSITY DRAMS

FIELD OF THE INVENTION

The present invention relates to semiconductor capacitors, and more specifically, to a method of making a high capacitance memory cell capacitor.

BACKGROUND OF THE INVENTION

Great progress ires been made in the manufacture of dynamic random access memory (DRAM) using high density integrated circuit technology. The industry has progressed from DRAMs of 16 Kbits capacity to DRAMs of up to 64 Mbits capacity.

A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture.

However, in order to achieve high performance (i.e. high density), memory cells in DRAM technology must be scaled down to the submicrometer range. Thus, as the capacity of DRAMs has increased, the size of the memory cells must steadily decrease. For very small memory cells, planar capacitors become very difficult to use reliably. Specifically, as the size of the capacitor decreases, the capacitance of the capacitor also decreases. Similarly, the size of the charge capable of being stored by the capacitor decreases. This results in the capacitor being very susceptible to α particle interference. Additionally, as the capacitance decreases, the charge held by storage capacitor must be refreshed often.

Prior art approaches to overcoming these problems have resulted in the development of the trench capacitor (see for example U.S. Pat. No. 5,374,580) and the stacked capacitor. The trench capacitor has the well-known problem of "gated diode leakage," which is the leakage of current resulting in the trench capacitor failing to hold a charge. The stacked capacitor has the disadvantage of high manufacturing complexity.

Another way to increase the capacitance per unit area is to etch a groove in the capacitor terminal, thus increasing the area of the capacitor. See, for example, U.S. Pat. No. 4,225,945 and U.S. Pat. No. 5,374,580. Reducing the thickness of the dielectric also can improve the capacitance of the capacitor, but this approach is limited because of yield and reliability problems.

SUMMARY OF THE INVENTION

A method for manufacturing an integrated circuit capacitor is disclosed. The method comprises the steps of forming a first conductive layer on a semiconductor substrate, forming a composition layer on said first conductive layer, said composition layer including a plurality of sublayers, at least two of said sublayers having a susceptibility to etching that differs, forming a photoresist mask pattern atop said composition layer;, removing said first conductive layer and said composition layer not protected by said photoresist mask pattern, etching said composition layer, forming a second conductive layer on said substrate and over said composition layer, forming spacers from said second conductive layer on the sides of said composition layer, removing said composition layer, forming a dielectric film on the surface of said first conductive layer and said second conductive layer, and forming a third conductive layer over said dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the crown shape capacitor having horizontal fins described herein includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process are referred to as "patterning and etching."

In addition to the basic patterning and etching, the present invention uses high etching selectivity between BPSG (borophosphosilicate glass) and CVD silicon dioxide to form a tooth like resulting structure having horizontal fingers. As will be seen below, this technique can be used to form a crown shape capacitor with horizontal fins.

Figure 1:
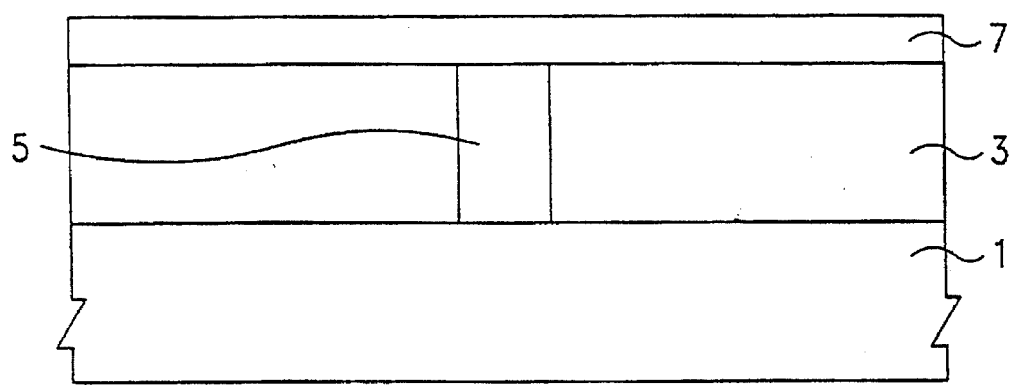
FIG. 1 is a cross section view of a semiconductor wafer illustrating the step of forming a first conductive layer on a semiconductor substrate.

Referring to FIG. 1, a silicon wafer for holding DRAM cells is shown. The silicon wafer includes a single crystal substrate 1, a silicon dioxide layer 3, a contact window 5, and a first conductive layer 7. In the preferred embodiment, the single crystal substrate 1 is P-type with a <100> crystallographic orientation.

Typically the gate electrode of the access transistor is formed in substrate 1. Similarly, source and drain impurity regions are also formed under the contact window 5. The formation of the access transistors for DRAMs is well known in the art and is not particularly germane to the present invention. Thus, only a cursory description of the transistors is given here. One example is seen in U.S. Pat. No. 5,489,791 to Arima et at. The silicon dioxide layer 3 is created for purposes of isolating the adjacent structures. The silicon dioxide layer 3 is formed by using chemical vapor deposition (CVD) process, using TEOS (tetraethylorthosilicate) as a source at a temperature between about 650° to 750° C., at a temperature 1 to 10 torrs, and to a thickness about 1000 to 20000 angstroms.

The first conductive layer 7 is formed over the contact window 5 and the silicon dioxide layer 3. The first conductive layer 7 is formed using conventional low pressure chemical vapor deposition (LPCVD). It can be appreciated that other methods of depositing the first conductive layer 7 can also be used. The thickness of the first conductive layer 7 is optimally 1000 angsttoms. The first conductive layer 7 is chosen from doped polysilicon or in-situ doped polysilicon. Alternatively, a metal layer, such as aluminum, copper, tungsten, titanium can also be used as the first conductive layer 7.

Figure 2:
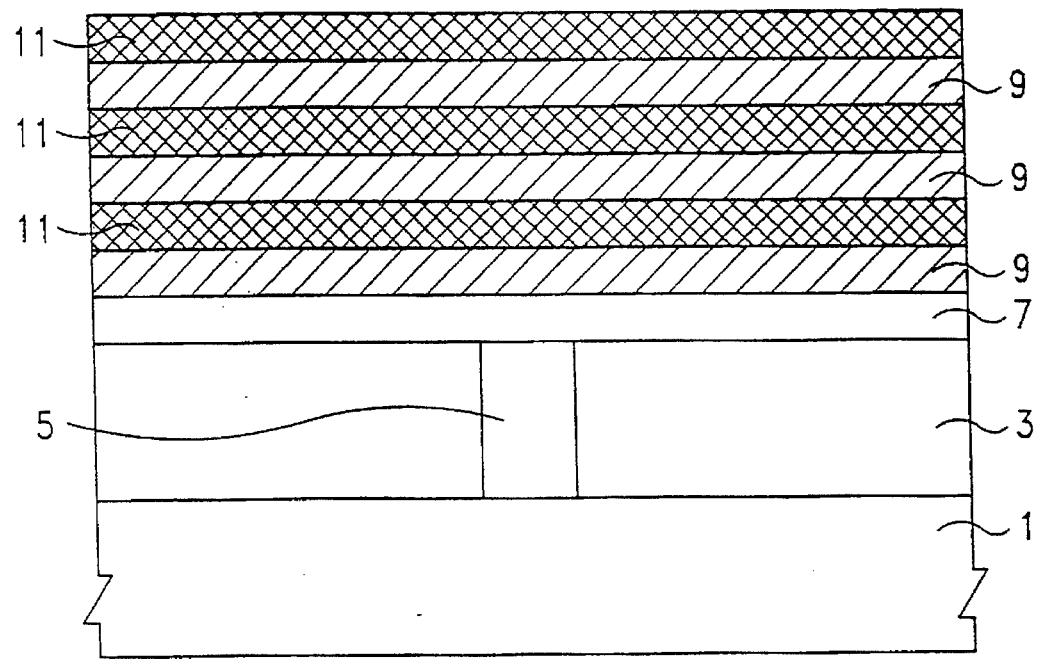
FIG. 2 is a cross section view of a semiconductor wafer illustrating the step of forming a composition layer consisting of alternating BPSG (borophosphosilicate glass) layers and CVD-oxide (chemical vapor deposition oxide) layers onto the first conductive layer.

Turning next to FIG. 2, a composition layer consisting of alternating BPSG layers 9 and silicon dioxide layers 11 is formed on the first conductive layer 7. The composition layer can be formed on the first conductive layer 7 repeatedly by deposition. The composition layers are composed of odd layers and even layers. The odd layers may be BPSG layers and the even layers may be silicon dioxide layers, or alternatively, the odd layers may be silicon dioxide layers and the even layers may be BPSG layers. The BPSG layers 9 can be formed by low pressure chemical vapor deposition using tetraethylorthosilicate (TEOS) as a reactant. Boron and phosphorus are added during the formation of the borophosphosilicate glass layer. The thickness of the BPSG layers is 300 to 500 angsttoms. The silicon dioxide layers 11 are formed by using a chemical vapor deposition process, using TEOS as a source at a temperature between about 650° to 750° C., at a pressure of 1 to 10 torrs, and to a thickness about 300 to 500 angstroms.

Figure 3:
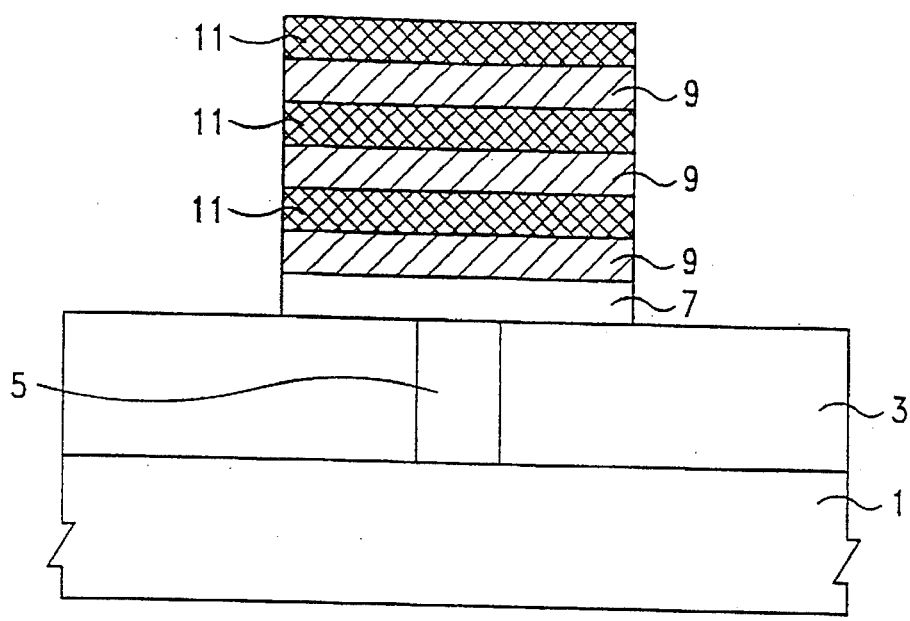
FIG. 3 is a cross section view of a semiconductor wafer illustrating the step of etching the first conductive layer and the composition layer.

Turning next to FIG. 3, patterning and etching are used to etch the first conductive layer 7, the BPSG layers 9 and the silicon dioxide layers 11 back until the silicon dioxide layer 3 is reached.

Figure 4:
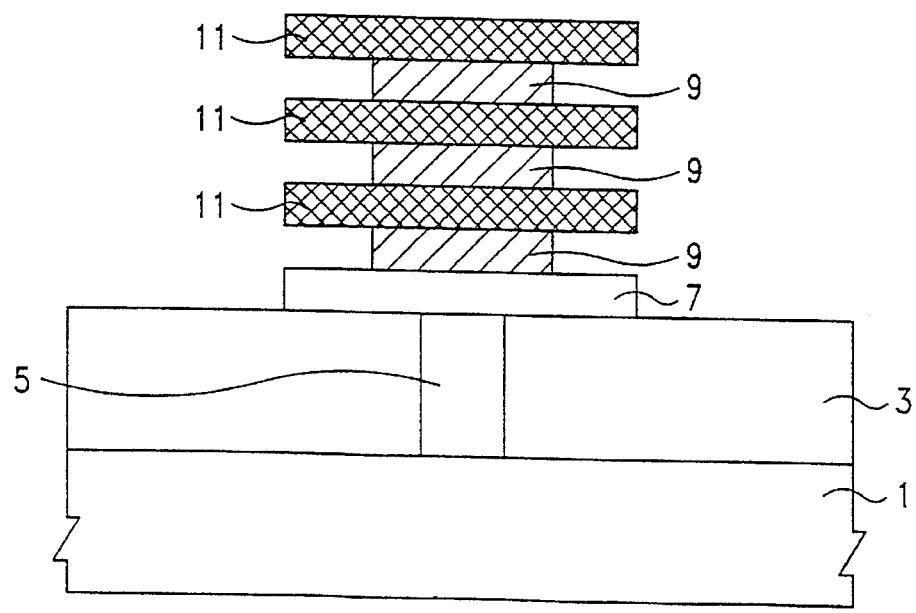
FIG. 4 is a cross section view of a semiconductor wafer illustrating the step of selectively etching the BPSG layers of the composition layer.

Next, as seen in FIG. 4, a selective etching step is applied. One key of the present invention is that the susceptability of BPSG to etching is much greater than that of silicon dioxide. In addition, the susceptability of BPSG to etching is also much greater than that of BSG, thus the BSG layer can be used to replace the silicon dioxide layer. Therefore, any etching is highly selective. The selective etching step utilizes a low pressure HF vapor to selectively etch the BPSG layers 9 and silicon dioxide layers 11. The relative susceptibility to etching of the BPSG layers 9 to the silicon dioxide layers 11 is about 2000 to 1. This results in the BPSG layers 9 being etched away much more significantly than the silicon dioxide layers 11, resulting in the structure of FIG. 4.

Figure 5:
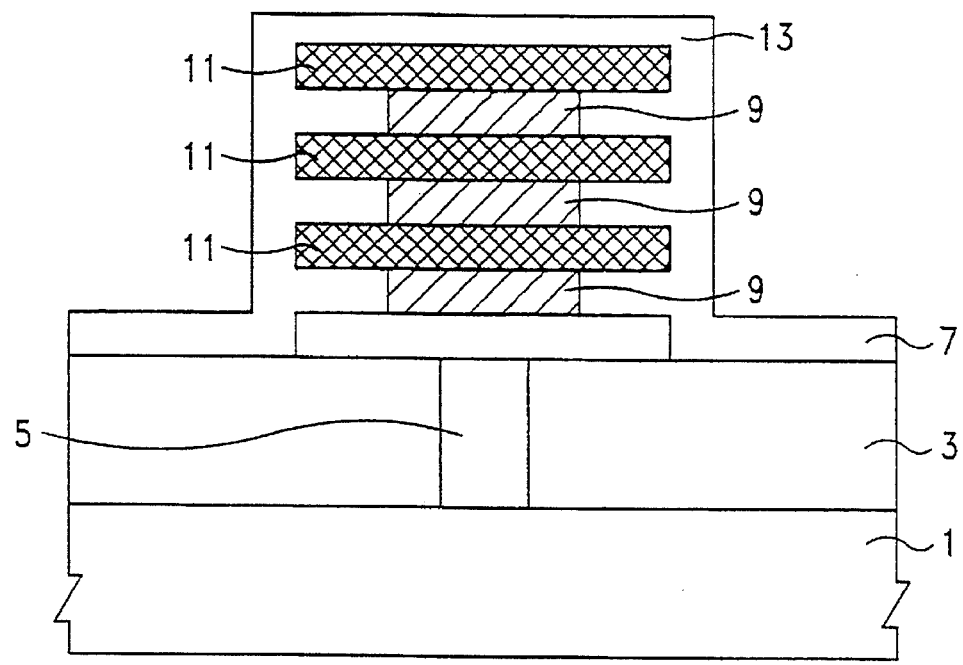
FIG. 5 is a cross section view of a semiconductor wafer illustrating the step of forming a second conductive layer.

Referring to FIG. 5, a second conductive layer 13 is deposited using a conventional LPCVD process over the first conductive layer 7, the BPSG layers 9 and the silicon dioxide layers 11. The second conductive layer 13 has a thickness between 1000 to 2000 angstroms. The second conductive layer 13 can be chosen from doped polysilicon, in-situ doped polysilicon, aluminum, copper, tungsten, or titanium. Moreover, the second conductive layer 13 is also formed between the BPSG layers 9 and the silicon dioxide layers 11.

Figure 6:
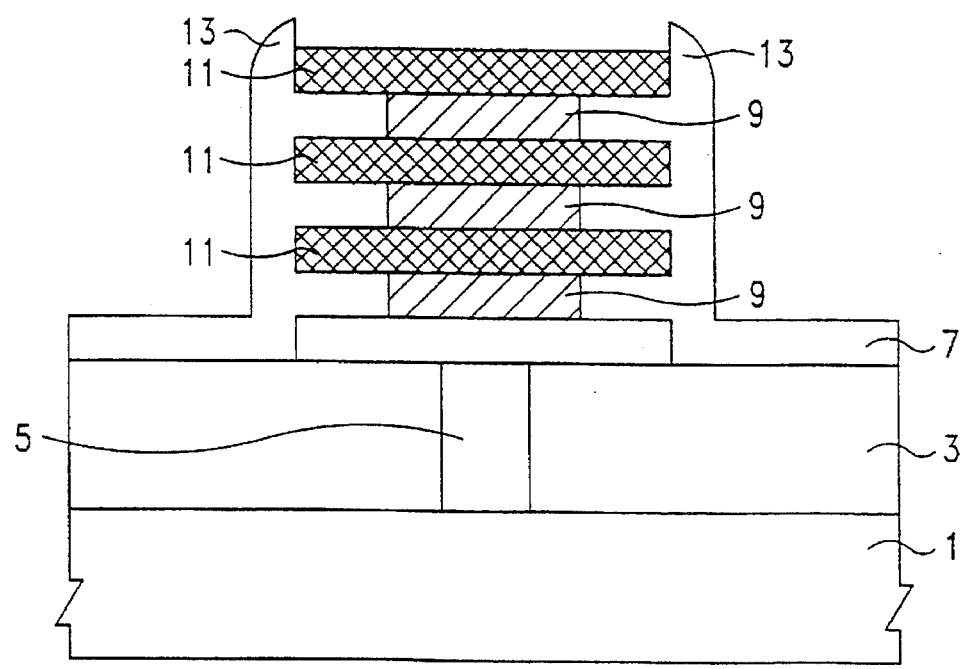
FIG. 6 is a cross section view of a semiconductor wafer illustrating the step of etching back the second conductive layer to form the spacer.

Next, an electron cyclotron resonance (ECR) process is used to etch the second conductive layer 13 to the silicon dioxide layer 3. The second conductive layer 13 is anisotropically etched back by dry etching, using an ECR process to form spacers 13. The resulting structure is shown in FIG. 6.

Figure 7:
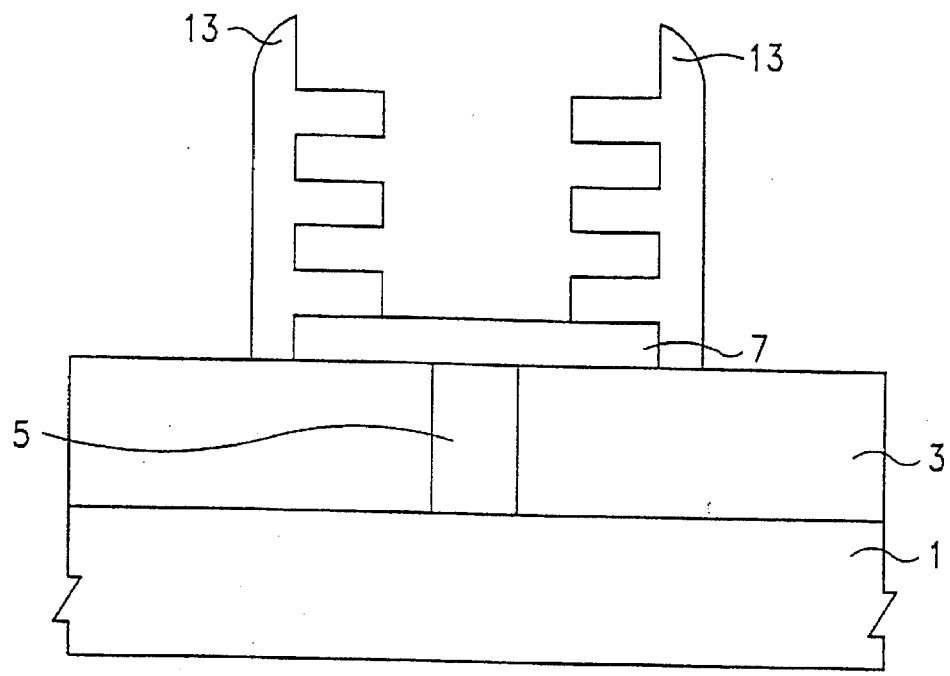
FIG. 7 is a cross section view of a semiconductor wafer illustrating the step of removing the BPSG and CVD silicon dioxide composition layers.

As shown in FIG. 7, the BPSG layers 9 and the silicon dioxide layers 11 are removed using a BOE (buffer oxide etching) solution to form a crown shaped structure with horizontal fins that consists of the first conductive layer 7 and the second conductive layer 13. The crown shape structure with horizontal fins is used as the bottom storage electrode of the capacitor.

Figure 8:
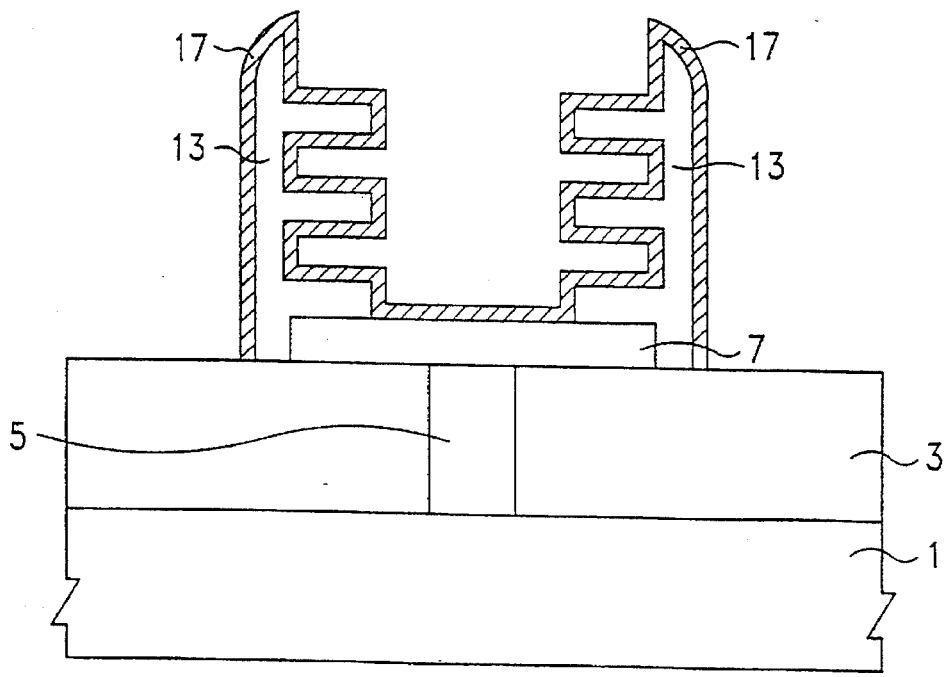
FIG. 8 is a cross section view of a semiconductor wafer illustrating the step of forming a dielectric layer on the first conductive layer and the second conductive layer.

Turning next to FIG. 8, the next step is the deposition of a dielectric film 17 along the surface of the first and second conductive layers 7 and 13. The dielectric film 17 is preferably formed of either a double film of nitride/oxide film, a triple film of oxide/nitride/oxide, or any other high dielectric film such as tantalum oxide($Ta_2O_5$).

Figure 9:
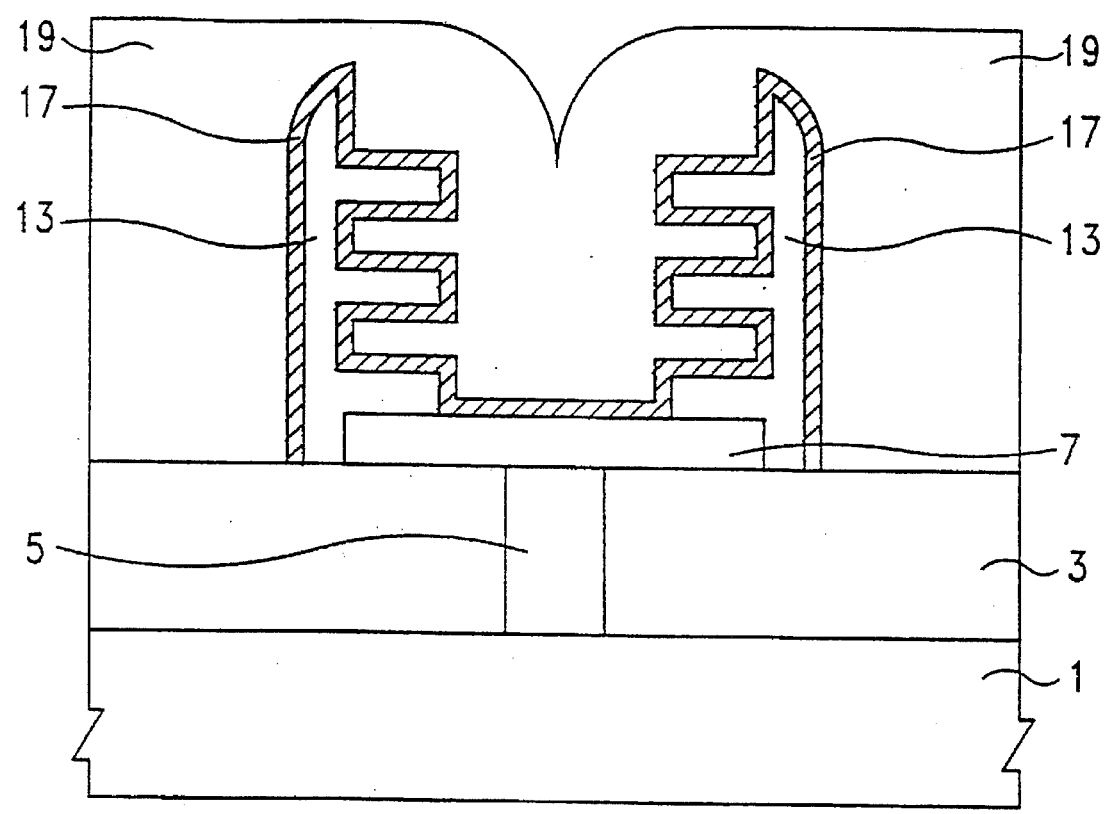
FIG. 9 is a cross section view of a semiconductor wafer illustrating the step of forming of a third conductive layer on the dielectric layer.

Finally, as shown in FIG. 9, a third conductive layer 19 is deposited using a conventional LPCVD process over the dielectric film 17. The third conductive layer 19 is used as the top storage electrode and is formed of doped polysilicon, in-situ doped polysilicon, aluminum, copper, tungsten or titanium. Thus, a semiconductor capacitor comprising a third conductive layer 19 as the top storage electrode, a dielectric 17, and first and second conductive layers 7 and 13 as the bottom storage electrode is formed.

The present invention thus provides capacitors with an enlarged surface area. The present invention uses the high etching selectivity between BPSG and CVD silicon dioxide to fabricate the capacitor. Moreover, the crown shape structure and the horizontal fins increases the surface area of the capacitor. Therefore the present invention increases the performance of the capacitor.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:

forming a first conductive layer on a semiconductor substrate;

forming a composition layer on said first conductive layer, said composition layer consisting of alternating BPSG layers and silicon dioxide layers;

forming a photoresist mask pattern atop said composition layer;

removing said first conductive layer and said composition layer not protected by said photoresist mask pattern;

selectively etching said BPSG layers and said silicon dioxide layers by using low pressure HF vapor, the relative susceptibility to etching of said BPSG layers to said silicon dioxide layers being about 2000 to 1;

forming a second conductive layer on said substrate and over said composition layer;

forming spacers from said second conductive layer on the sides of said composition layer;

removing said composition layer by using a buffer oxide etching;

forming a dielectric film on the surface of said first conductive layer and said second conductive layer; and forming a third conductive layer over said dielectric film.

2. The method of claim 1, wherein the step of forming said first conductive layer on said substrate comprises forming said first conductive layer on an oxide layer formed on said substrate, said first conductive layer contacting said substrate through contact windows in said oxide layer.

3. The method of claim 1, wherein said first conductive layer has a thickness about 1000 angstroms.

4. The method of claim 1, wherein said BPSG layers have a thickness of a range between 300–500 angstroms, said silicon dioxide layers have a thickness of a range between 300–500 angstroms.

5. The method of claim 1, after the step of etching said first conductive layer and said BPSG layers and said silicon dioxide layers, further comprising the step of removing said photoresist.

6. The method of claim 1, wherein said second conductive layer is formed on said first conductive layer and said composition layer such that said second conductive layer is also formed between said BPSG layers and carbon dioxide layers.

7. The method of claim 6, wherein said second conductive layer has a thickness of a range between 1000–2000 angstroms.

8. The method of claim 1, wherein the step of forming said spacer includes anisotropically etching back said second conductive layer.

9. The method of claim 1, wherein said dielectric film is formed of tantalum oxide($Ta_2O_5$).

10. The method of claim 1, wherein said dielectric film is formed of a triple film of oxide/nitride/oxide.

11. The method of claim 1, wherein said dielectric film is formed of a double film of nitride/oxide film.

12. The method of claim 1, wherein said first conductive layer, said second conductive layer, said third conductive layer are selected from the group of doped polysilicon, in-situ doped polysilicon, aluminum, copper, tungsten, and titanium combinations thereon.

13. A method for manufacturing an integrated circuit capacitor, the method comprising the steps of:

forming a first conductive layer on a semiconductor substrate;

forming on said first conductive layer a composition layer that consists of alternating sublayers of BPSG sublayers and silicon dioxide sublayers;

forming a photoresist mask pattern on said composition layer;

removing said first conductive layer and said composition layer not covered by said photoresist mask pattern;

using highly selective etching to remove a portion of said BPSG sublayers and said silicon dioxide sublayers by using low pressure HF vapor, the relative susceptibility to etching of said BPSG sublayers to said silicon dioxide sublayers being about 2000 to 1;

forming a second conductive layer on said substrate and over said composition layer; etching said second conductive layer to form spacers on the sides of said composition layer by anisotropically etching back said second conductive layer;

removing said composition layer by using a buffer oxide etchant;

forming a dielectric film on the surface of said first conductive layer and said second conductive layer; and forming a third conductive layer over said dielectric film.

14. A method of forming a horizontal polysilicon fin comprising the steps of:

forming a first polysilicon layer;

forming a composition layer that consists of alternating BPSG layers and silicon dioxide layers on said first polysilicon layer;

forming a photoresist mask pattern on said composition layer;

removing said first polysilicon layer and said BPSG layers and said silicon dioxide layers not covered by said first photoresist mask pattern;

removing said photoresist;

using high selective etching to remove a portion of said BPSG layers and said silicon dioxide layers by using low pressure HF vapor, the relative susceptibility to etching of said BPSG layers to said silicon dioxide layers being about 2000 to 1;

forming a second polysilicon layer on said substrate and over said composition layer;

forming spacers on the sides of said composition layer by anisotropically etching back said second polysilicon layer; and removing said composition layer by using a buffer oxide etchant.

* * * * *